United States Patent
Winkler et al.

(10) Patent No.: US 7,741,583 B2
(45) Date of Patent: Jun. 22, 2010

(54) BAKE PLATE LID CLEANER AND CLEANING METHOD

(75) Inventors: Mark G. Winkler, Ridgefield, CT (US); Thomas E. Winter, Pleasant Valley, NY (US)

(73) Assignee: Tokyo Electron Limited, Tokyo (JP)

( * ) Notice: Subject to any disclaimer, the term of this patent is extended or adjusted under 35 U.S.C. 154(b) by 679 days.

(21) Appl. No.: 11/689,650

(22) Filed: Mar. 22, 2007

(65) Prior Publication Data
US 2008/0230534 A1   Sep. 25, 2008

(51) Int. Cl.
*F27B 5/14* (2006.01)
*B05B 3/02* (2006.01)
*B05C 9/06* (2006.01)
*B05C 11/00* (2006.01)

(52) U.S. Cl. .................. 219/390; 118/70; 134/61; 134/152; 134/902

(58) Field of Classification Search .................. None
See application file for complete search history.

(56) References Cited

U.S. PATENT DOCUMENTS

| | | | | |
|---|---|---|---|---|
| 5,312,487 A | * | 5/1994 | Akimoto et al. | 118/70 |
| 5,565,058 A | * | 10/1996 | Banholzer et al. | 156/345.1 |
| 5,718,763 A | * | 2/1998 | Tateyama et al. | 134/902 |
| 5,762,708 A | * | 6/1998 | Motoda et al. | 134/902 |
| 6,391,110 B1 | * | 5/2002 | Satou et al. | 118/70 |
| 7,515,264 B2 | * | 4/2009 | Otsuki et al. | 356/338 |
| 2007/0166655 A1 | * | 7/2007 | Ooshima et al. | 432/120 |

* cited by examiner

*Primary Examiner*—Joseph M Pelham
(74) *Attorney, Agent, or Firm*—Wood, Herron & Evans, L.L.P.

(57) ABSTRACT

A method and system for positioning a wafer on a bake plate in a processing module that includes lowering a bake plate cover assembly over the wafer during a baking process, raising the bake plate cover assembly after the baking process, removing the wafer, determining whether the bake plate cover assembly requires cleaning, then either processing another wafer if the cover assembly does not need cleaning or establishing a cleaning process for the bake plate cover assembly if the cover does need cleaning. Automated sensing of the state of the cover assembly may be employed, and cleaning process may be automatically performed in response to the cleaning need determination.

18 Claims, 11 Drawing Sheets

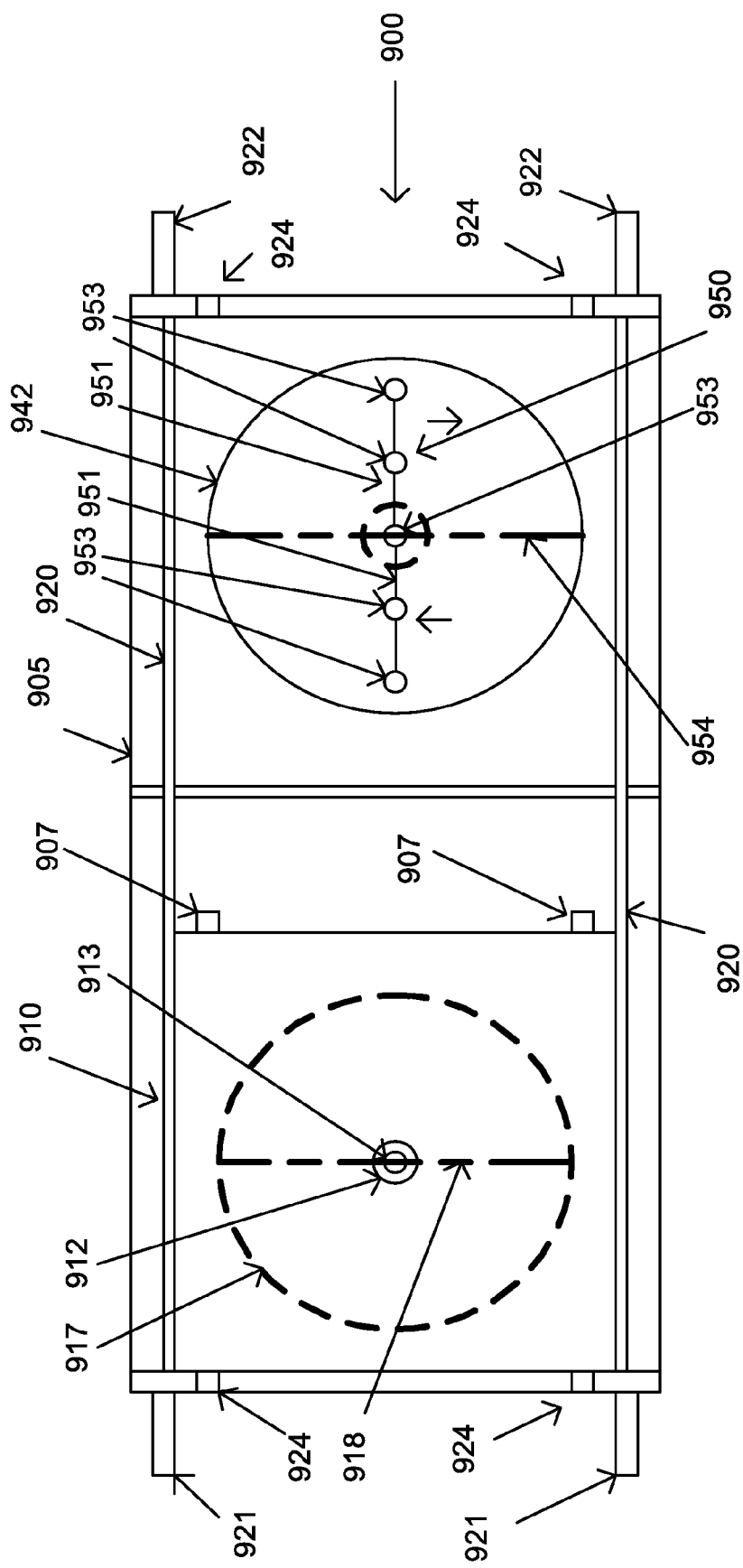

US 7,741,583 B2

BAKE PLATE LID CLEANER AND CLEANING METHOD

FIELD OF THE INVENTION

The invention relates to wafer processing, and more particularly, to a bake plate lid cleaner and method for using.

BACKGROUND OF THE INVENTION

Minimizing defects during wafer processing will continue to be a critical path to attaining cost effective manufacturing of advanced semiconductor devices. Hard particles can block etch processes causing an electrical "open" or "short" in the circuit. Particles of lesser size and those falling on critical locations on a device may create perturbations in the active features' critical dimensions, producing adverse or fatal consequences during device operation.

The gate level defect maximum density requirements for 15 nm gate technology is expected to be approximately $0.01/cm^{**}2$ at 10 nm in size per the ITRS 2005 roadmap. No lithographic and etch process tool exists with these performance capabilities.

One source for hard particle defect generation in the imaging process is the post-apply bake process. In these processes, solvent-rich, polymer-containing, spun-on films are baked at temperatures close to and even well above the boiling point of the casting solvent used. Temperatures range from 80 to 250 C. The most common byproducts of the post-apply bake are volatile organic compounds (VOCs) and some amount of polymer or other hard material that deposits on the inside of the bake chamber. This hard material builds up and eventually sheds or peels off, creating particles with time, usually after about 4,000 to 15,000 wafers are processed. The degree of particle generation depends on chemistry and bake temperature. The bake plate lid is typically mounted directly above the production wafer, so what comes loose from the lid often falls onto the production wafer.

Current solutions to the problem of particles from the bake plate lid include cooling down the bake system, removing the bake plate lid and cleaning it in various chemicals, including by dunking it in a bath of solvent. After cleaning, the bake system must be reassembled and tested for process compliance. This cleaning process can take 4 to 6 hours, during which time the tool is unusable for manufacturing.

It is anticipated that more frequent cleaning of bake plate lids will be required to meet the future device defect maximum density requirements.

SUMMARY OF THE INVENTION

According to certain embodiments of the invention, a method of processing a wafer is provided comprising positioning a wafer on a bake plate in a processing module, lowering a bake plate cover assembly over the wafer during a baking process, raising the bake plate cover assembly after the baking process, removing the wafer from the bake plate, determining a first processing state for the bake plate cover assembly, and then either processing another wafer if the first processing state is a first value, or establishing a cleaning process for the bake plate cover assembly if the first processing state is a second value.

Further according to embodiments of the invention, a system for processing a wafer is provided comprising means for positioning a wafer on a bake plate in a processing module, means for lowering a bake plate cover assembly over the wafer during a baking process, means for raising the bake plate cover assembly after the baking process, means for removing the wafer from the bake plate, means for determining a first processing state for the bake plate cover assembly, and means responsive to the determining means for either processing another wafer if the first processing state is a first value or for establishing a cleaning process for the bake plate cover assembly if the first processing state is a second value.

According to other embodiments of the invention, a system for processing a wafer is provided comprising a wafer transporting system for positioning a wafer on a bake plate in a processing module, and for removing the wafer after the wafer is processed, first position control units for lowering a bake plate cover over the wafer during a baking process, and for raising the bake plate cover after the baking process; and a controller programmed to determine a first processing state for the bake plate cover and for either instructing the processing module to process another wafer if the first processing state is a first value or for determining a cleaning process for the bake plate cover if the first processing state is a second value.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF SEVERAL EMBODIMENTS

Embodiments of the invention provide a method and processing system for controlling and rapidly lowering the temperature of a hotplate used for supporting and heating-treating wafers. Embodiments of the invention may be applied to heat-treating of resist-coated wafers with high wafer throughput. The terms "wafer" and "substrate" are used interchangeably herein to refer to a thin slice of material, such as a silicon crystal or glass material, upon which microcircuits are constructed, for example by diffusion, deposition, and etching of various materials.

Figure 1:
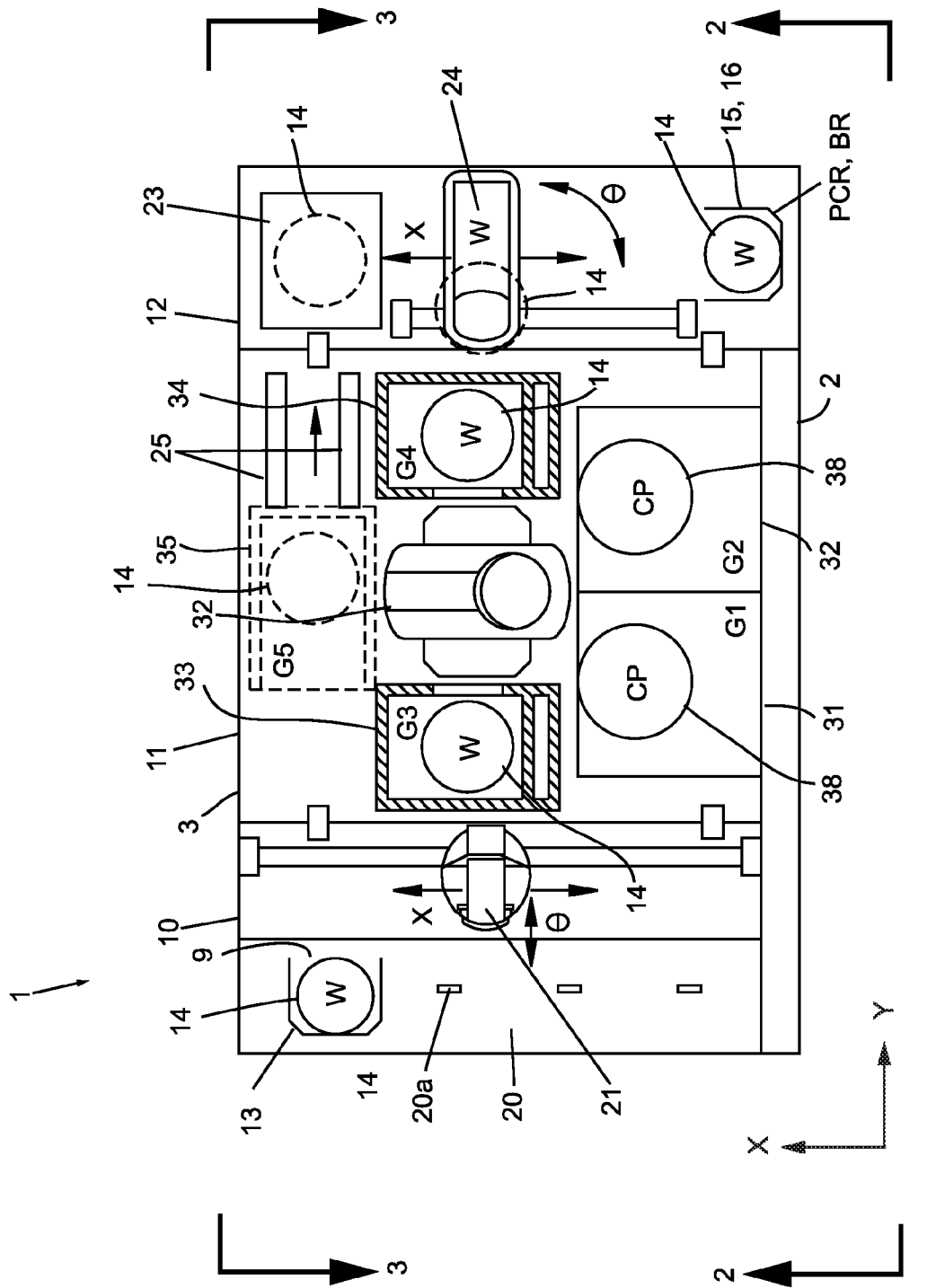
FIG. 1 is a top view of a schematic diagram of a coating/developing system for use in accordance with embodiments of the invention.
Figure 2:
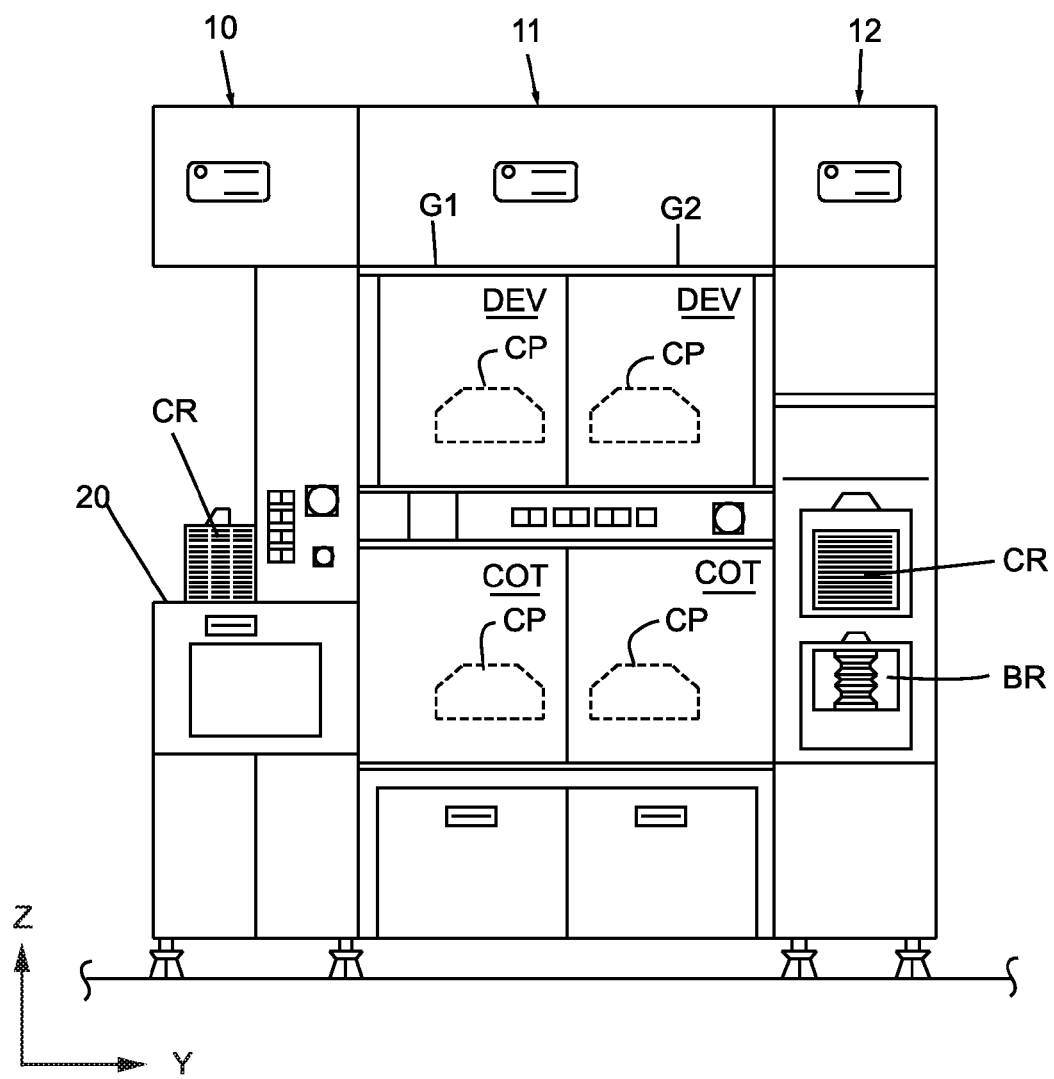
FIG. 2 is a front view of the coating/developing system of FIG. 1.
Figure 3:
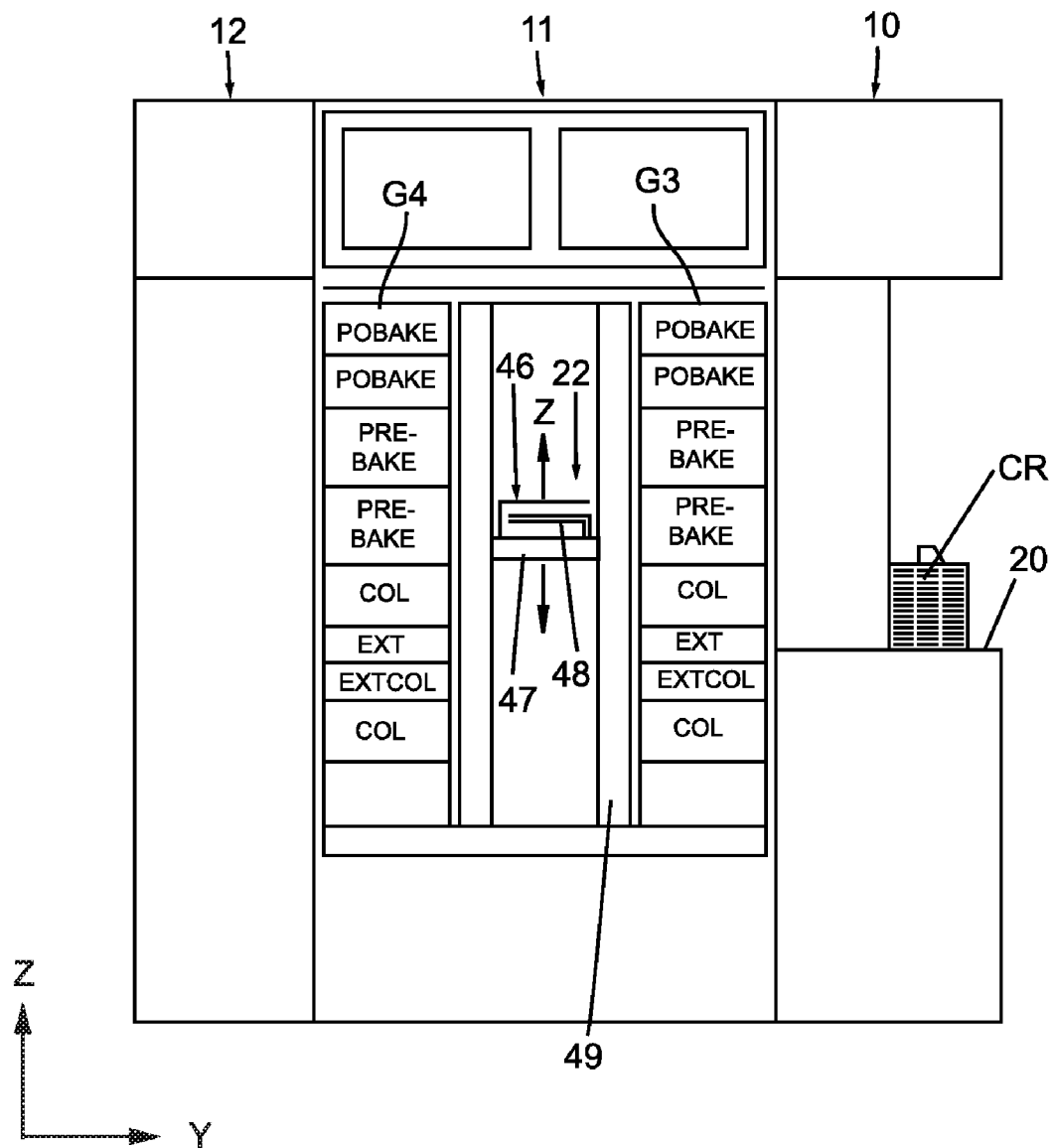
FIG. 3 is a partially cut-away back view of the coating/developing system of FIG. 1, as taken along line 3-3.

With reference to FIGS. 1-3, a coating/developing processing system 1 has a load/unload section 10, a process section 11, and an interface section 12. The load/unload section 10 has a cassette table 20 on which cassettes (CR) 13, each storing a plurality of semiconductor wafers (W) 14 (e.g., 25), are loaded and unloaded from the processing system 1. The process section 11 has various single wafer processing units for processing wafers 14 sequentially one by one. These processing units are arranged in predetermined positions of multiple stages, for example, within first (G1), second (G2), third (G3), fourth (G4) and fifth (G5) multiple-stage process unit groups 31, 32, 33, 34, 35. The interface section 12 is interposed between the process section 11 and one or more light exposure systems (not shown), and is configured to transfer resist coated wafers between the process section. The one or more light exposure systems can include a resist patterning system such as a photolithography tool that transfers the image of a circuit or a component from a mask or onto a resist on the wafer surface.

The coating/developing processing system 1 also includes a CD metrology system for obtaining CD metrology data from test areas on the patterned wafers. The CD metrology system may be located within the processing system 1, for example at one of the multiple-stage process unit groups 31, 32, 33, 34, 35. The CD metrology system can be a light scattering system such as an optical digital profilometry (ODP) system.

The ODP system may include a scatterometer, incorporating beam profile ellipsometry (ellipsometer), and beam profile reflectometry (reflectometer), an example of which is that commercially available from Therma-Wave, Inc. (1250 Reliance Way, Fremont, Calif. 94539) or Nanometrics, Inc., 1550 Buckeye Drive, Milpitas, Calif. 95035. ODP software is available from Timbre Technologies Inc., 2953 Bunker Hill Lane, Santa Clara, Calif. 95054.

When performing optical metrology, such as scatterometry, a structure on a substrate, such as a semiconductor wafer or flat panel, is illuminated with electromagnetic (EM) radiation, and a diffracted signal received from the structure is utilized to reconstruct the profile of the structure. The structure may include a periodic structure, or a non-periodic structure. Additionally, the structure may include an operating structure on the substrate (i.e., a via, or contact hole, or an interconnect line or trench, or a feature formed in a mask layer associated therewith), or the structure may include a periodic grating or non-periodic grating formed proximate to an operating structure formed on a substrate. For example, the periodic grating can be formed adjacent a transistor formed on the substrate. Alternatively, the periodic grating can be formed in an area of the transistor that does not interfere with the operation of the transistor. The profile of the periodic grating is obtained to determine whether the periodic grating, and by extension the operating structure adjacent the periodic grating, has been fabricated according to specifications.

Still referring to FIGS. 1-3, a plurality of projections 20*a* are formed on the cassette table 20. A plurality of cassettes 13 are each oriented relative to the process section 11 by these projections 20*a*. Each of the cassettes 13 mounted on the cassette table 20 has a load/unload opening 9 facing the process section 11.

The load/unload section 10 includes a first sub-arm mechanism 21 that is responsible for loading/unloading the wafer W into/from each cassette 13. The first sub-arm mechanism 21 has a holder portion for holding the wafer 14, a back and forth moving mechanism (not shown) for moving the holder portion back and forth, an X-axis moving mechanism (not shown) for moving the holder portion in an X-axis direction, a Z-axis moving mechanism (not shown) for moving the holder portion in a Z-axis direction, and a (theta) rotation mechanism (not shown) for rotating the holder portion around the Z-axis. The first sub-arm mechanism 21 can gain access to an alignment unit (ALIM) 41 and an extension unit (EXT) 42 belonging to a third (G3) process unit group 33, as further described below.

With specific reference to FIG. 3, a main arm mechanism 22 is liftably arranged at the center of the process section 11. The process units G1-G5 are arranged around the main arm mechanism 22. The main arm mechanism 22 is arranged within a cylindrical supporting body 49 and has a liftable wafer transporting system 46. The cylindrical supporting body 49 is connected to a driving shaft of a motor (not shown). The driving shaft may be rotated about the Z-axis in synchronism with the wafer transporting system 46 by an angle. The wafer transporting system 46 has a plurality of holder portions 48 movable in a front and rear direction of a transfer base table 47.

Units belonging to first (G1) and second (G2) process unit groups 31, 32, are arranged at the front portion 2 of the coating/developing processing system 1. Units belonging to the third (G3) process unit group 33 are arranged next to the load/unload section 10. Units belonging to a fourth (G4) process unit group 34 are arranged next to the interface section 12. Units belonging to a fifth (G5) process unit group 35 are arranged in a back portion 3 of the processing system 1.

With reference to FIG. 2, the first (G1) process unit group 31 has two spinner-type process units for applying a predetermined treatment to the wafer 14 mounted on a spin chuck (not shown) within the cup (CP) 38. In the first (G1) process unit group 31, for example, a resist coating unit (COT) 36 and a developing unit (DEV) 37 are stacked in two stages sequentially from the bottom. In the second (G2) process unit group 32, two spinner type process units such as a resist coating unit (COT) 36 and a developing unit (DEV) 37, are stacked in two stages sequentially from the bottom. In an exemplary embodiment, the resist coating unit (COT) 36 is set at a lower stage than the developing unit (DEV) 37 because a discharge line (not shown) for the resist waste solution is desired to be shorter than a developing waste solution for the reason that the resist waste solution is more difficult to discharge than the developing waste solution. However, if necessary, the resist coating unit (COT) 36 may be arranged at an upper stage relative to the developing unit (DEV) 37.

With reference to FIG. 3, the third (G3) process unit group 33 has a cooling unit (COL) 39, an alignment unit (ALIM) 41, an adhesion unit (AD) 40, an extension unit (EXT) 42, two prebaking units (PREBAKE) 43, and two postbaking units (POBAKE) 44, which are stacked sequentially from the bottom.

Similarly, the fourth (G4) process unit group 34 has a cooling unit (COL) 39, an extension-cooling unit (EXTCOL) 45, an extension unit (EXT) 42, another cooling unit (COL) 39, two prebaking units (PREBAKE) 43 and two postbaking units (POBAKE) 44 stacked sequentially from the bottom. Although, only two prebaking units 43 and only two postbaking units 44 are shown, G3 and G4 may contain any number of prebaking units 43 and postbaking units 44. Furthermore, any or all of the prebaking units 43 and postbaking units 44 may be configured to perform PEB, post application bake (PAB), and post developing bake (PDB) processes.

In an exemplary embodiment, the cooling unit (COL) 39 and the extension cooling unit (EXTCOL) 45, to be operated at low processing temperatures, are arranged at lower stages, and the prebaking unit (PREBAKE) 43, the postbaking unit (POBAKE) 44 and the adhesion unit (AD) 40, to be operated at high temperatures, are arranged at the upper stages. With this arrangement, thermal interference between units may be reduced. Alternatively, these units may have different arrangements.

At the front side of the interface section 12, a movable pick-up cassette (PCR) 15 and a non-movable buffer cassette (BR) 16 are arranged in two stages. At the backside of the interface section 12, a peripheral light exposure system 23 is arranged. The peripheral light exposure system 23 can contain a lithography tool. Alternately, the lithography tool and the ODP system may be remote to and cooperatively coupled to the coating/developing processing system 1. At the center portion of the interface section 12, a second sub-arm mechanism 24 is provided, which is movable independently in the X and Z directions, and which is capable of gaining access to both cassettes (PCR) 15 and (BR) 16 and the peripheral light exposure system 23. In addition, the second sub-arm mechanism 24 is rotatable around the Z-axis by an angle and is designed to be able to gain access not only to the extension unit (EXT) 42 located in the fourth (G4) processing unit 34 but also to a wafer transfer table (not shown) near a remote light exposure system (not shown).

In the processing system 1, the fifth (G5) processing unit group 35 may be arranged at the back portion 3 of the backside of the main arm mechanism 22. The fifth (G5) processing unit group 35 may be slidably shifted in the Y-axis direction along a guide rail 25. Since the fifth (G5) processing unit group 35 may be shifted as mentioned, maintenance operation may be applied to the main arm mechanism 22 easily from the backside.

Figure 4:
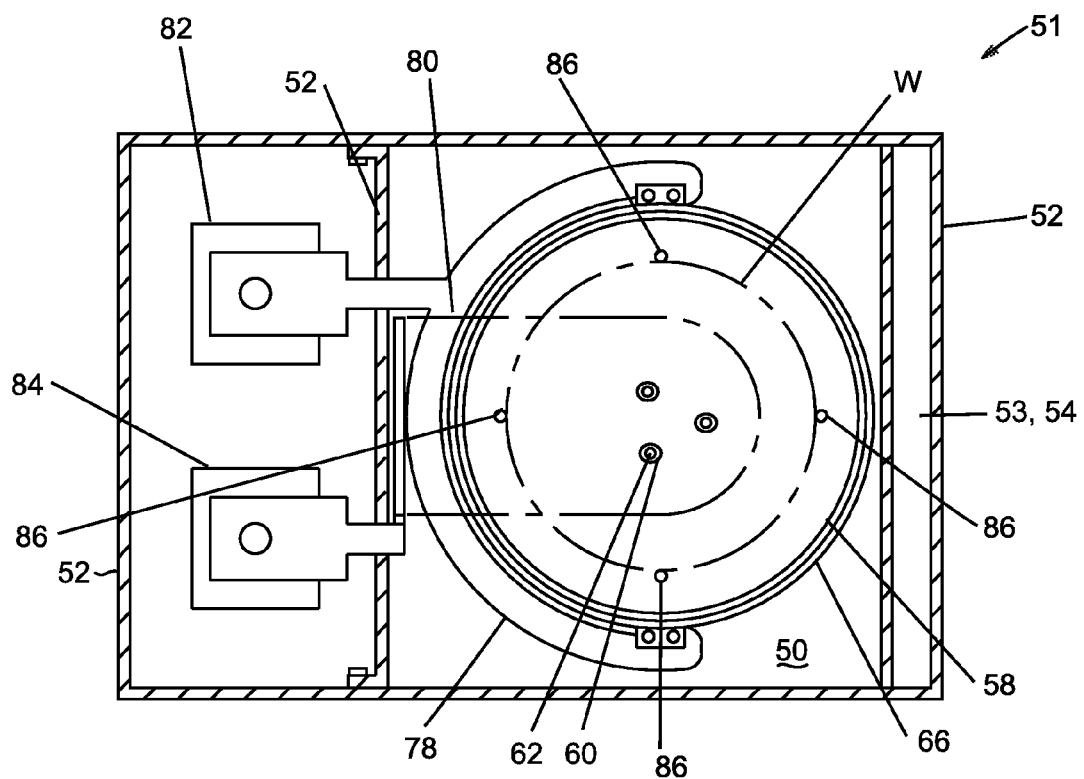
FIG. 4 is a cross-sectional view of a single heat treatment processing system of FIG. 3.
Figure 5:
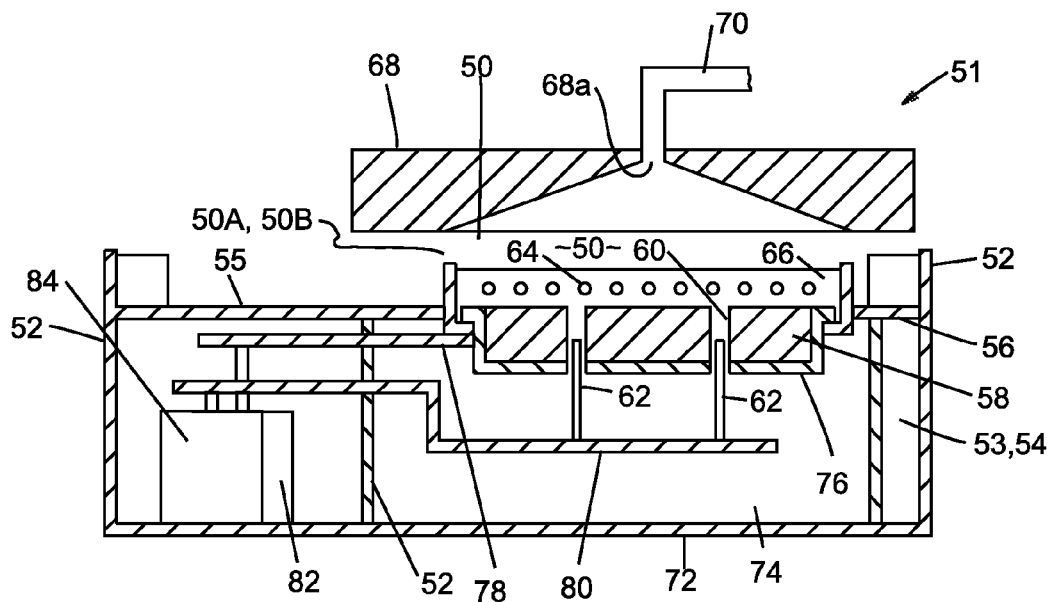
FIG. 5 is a plan view of the heat treatment processing system of FIG. 4, as viewed from line 5-5.

The prebaking unit (PREBAKE) 43, the postbaking unit (POBAKE) 44, and the adhesion unit (AD) 40 each comprise a heat treatment system in which wafers 14 are heated to temperatures above room temperature. With reference to FIGS. 4 and 5, each heat treatment system 51 includes a processing chamber 50, a hotplate 58, and a resistance heater (not shown) embedded in the hotplate 58.

The hotplate 58 has a plurality of through-holes 60 and a plurality of lift pins 62 inserted into the through-holes 60. The lift pins 62 are connected to and supported by an arm 80, which is further connected to and supported by a rod 84a of a liftable vertical cylinder 84. When the rod 84a is actuated to protrude from the vertical cylinder 84, the lift pins 62 protrude from the hotplate 58, thereby lifting the wafer 14 from the upper surface 92 of the hotplate 58.

With continued reference to FIGS. 4 and 5, the processing chamber 50 is defined by a sidewall 52, a horizontal shielding plate 55, and a cover 68. Openings 50A, 50B are formed at a front surface side (aisle side of the main arm mechanism 22) and a rear surface side of the processing chamber 50, respectively. The wafer 14 is loaded into and unloaded from the processing chamber 50 through the openings 50A, 50B. A circular opening 56 is formed at the center of the horizontal shielding plate 55. The hotplate 58 is housed in the opening 56. The hotplate 58 is supported by the horizontal shielding plate 55 with the aid of a supporting plate 76.

A ring-form shutter 66 is attached to the outer periphery of the hotplate 58. Air holes 64 are formed along the periphery of the shutter 66 at intervals of central angles of two degrees. The air holes 64 communicate with a cooling gas supply source (not shown).

The shutter 66 is liftably supported by a cylinder 82 via a shutter arm 78. The shutter 66 is positioned at a place lower than the hotplate 58 at a non-operation time (i.e., when a wafer is not present on the upper hotplate surface 92), whereas, at an operation time (i.e., when a wafer is being heat-treated on the upper hotplate surface 92), shutter 66 is lifted up to a position higher than the hotplate 58 and between the hotplate 58 and the cover 68. When the shutter 66 is lifted up, at an operation time, an gas, such as nitrogen gas or air, is exhausted from the air holes 64.

Gas generated from the surface of the wafer 14 at the heat treatment detected temperature time is exhausted through the exhaust port 68a and vented from the processing chamber 50 via exhaust pipe 70 to an evacuation unit (not shown).

With reference to FIGS. 4 and 5, a compartment 74 is defined by the horizontal shielding plate 55, two sidewalls 53, and a bottom plate 72 formed below the horizontal shielding plate 55. Hotplate supporting plate 76, shutter arm 78, lift pin arm 80, and liftable cylinders 82, 84 are arranged in the compartment 74.

With reference to FIG. 5, a plurality of projections 86 are formed on an upper surface of the hotplate 58 for accurately positioning the wafer 14. In addition, a plurality of smaller projections (not shown) is formed on the upper surface of the hotplate 58. When the wafer 14 is mounted on the hotplate 58, top portions of these smaller projections contact the wafer 14, which produces a small gap between the wafer 14 and the hotplate 58 that prevents the lower surface of the wafer 14 from being strained and damaged.

With reference to FIGS. 4 and 5, the heat treatment system 51 further includes a gas injection system 90 coupled to gas lines 90a and 90b that are configured for exposing the upper surface 92 of the hotplate 58 to an inert gas stream for rapidly cooling the upper surface 92 and the rest of the hotplate 58 when a wafer is not present on the upper surface 92. The inert gas can, for example, include argon (Ar) or nitrogen (N2). Although two gas lines are depicted in FIGS. 4 and 5, any number of gas lines may be used.

Figure 6:
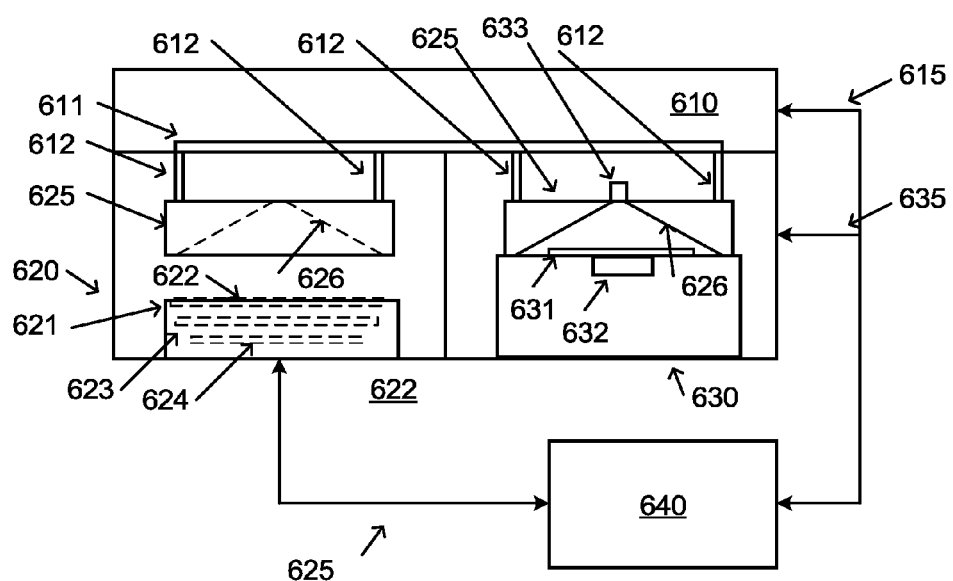
FIG. 6 illustrates a simplified block diagram of a cleaning system in accordance with embodiments of the invention.

FIG. 6 illustrates a simplified block diagram of a cleaning system in accordance with embodiments of the invention. In the illustrated embodiment, a cleaning system 600 is shown that comprises a transfer subsystem 610, a processing subsystem 620, a, a cleaning subsystem 630, and a controller 640. The transfer subsystem 610 can be coupled to the processing subsystem 620 and the cleaning subsystem 630. The controller 640 can be coupled to the processing subsystem 620 using a bi-directional link 625. The controller 640 can be coupled to the transfer subsystem 610 using bi-directional link 615 and can be coupled to the cleaning subsystem 630 using bi-directional link 635.

The processing subsystem 620 can include a bake plate module 621 and a bake plate cover 625. The bake plate module 621 can include a hotplate 623, a sensor 624, and wafer support means 622. A wafer (not shown) may be positioned on bake plate module 621 using wafer support means 622.

Hotplate 623 may have a circular shape and may comprise a number of segments (not shown). In addition, hotplate 623 may comprise a number of heating elements (not shown). For example, a heating element may be positioned within each segment of the hotplate 623. In an alternate embodiment, bake plate module 621 may incorporate a cooling element and/or a combined heating/cooling element rather than a heating element.

Bake plate module 621 may include a sensor 624, which may be a physical sensor and/or a virtual sensor. For example, sensor 624 may be a temperature sensor and/or pressure sensor. Controller 640 may be coupled to hotplate 623 and sensor 624. Various types of physical temperature sensors may be used. For example, the sensors 630 can include a thermocouple, a temperature-indicating resistor, a radiation type temperature sensor, and the like. Other physical sensors include contact-type sensors and non-contact sensors.

Controller 640 may be coupled to a processing system controller (not shown) capable of providing data to cleaning system 600. The data can include wafer information, layer information, process information, and metrology information. Wafer information can include composition data, size data, thickness data, and temperature data. Layer information can include the number of layers, the composition of the layers, and the thickness of the layers. Process information can include data concerning previous steps and the current step. Metrology information can include optical digital profile data, such as critical dimension (CD) data, profile data, and uniformity data, and optical data, such as refractive index (n) data and extinction coefficient (k) data. For example, CD data and profile data can include information for features and open areas in one or more layers, and can also include uniformity data.

Controller 640 may control the temperature of the bake plate module 621 to establish a temperature profile for each wafer. For example, controller 640 may receive instructions from a CD optimizer system (not shown) to adjust the temperature of each wafer based on CD metrology data received from processed wafers. The CD optimizer system may be contained in the processing system controller (not shown) or the CD optimizer system may be contained in the controller 640. In addition, temperature adjustments may be dependent upon the type of resist used on the wafers.

Controller 640 may comprise a microprocessor, a memory (e.g., volatile and/or non-volatile memory), and a digital I/O port. A program stored in the memory may be utilized to control the aforementioned components of a heat-treatment system according to a process recipe. Controller 640 may be configured to analyze the process data, to compare the process data with target process data, and to use the comparison to change a process and/or control the processing system components.

Transfer subsystem 610 can be used to move the bake plate cover 625 from the processing subsystem 620 to the cleaning subsystem 630. For example, transfer subsystem 610 can include horizontal transfer element 611 and vertical transfer elements 612. Alternatively, other transfer configurations may be used.

Cleaning subsystem 630 can be used to clean the bake plate cover 625 Cleaning subsystem 630 can include spraying assembly 631, control assembly 632, and exhausting assembly 633. Alternatively, the cleaning subsystem 630 may be configured differently.

Figure 7:
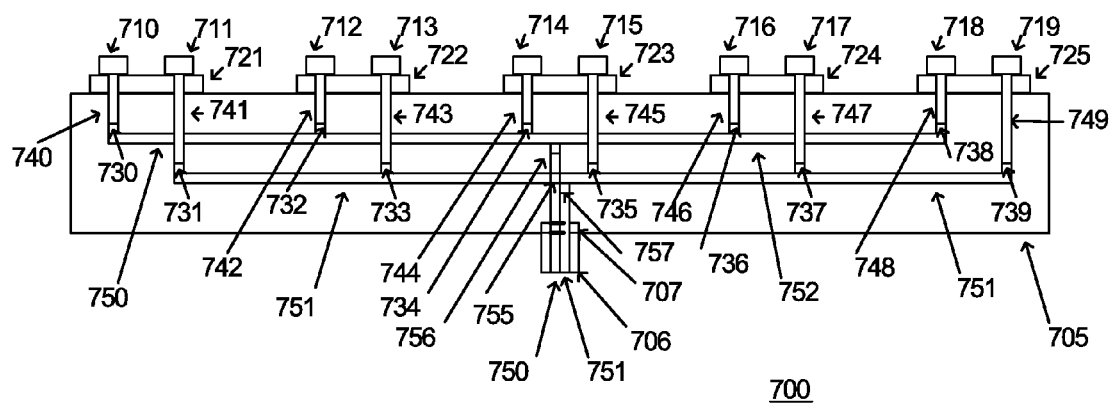
FIG. 7 shows an exemplary schematic view of a spray assembly in accordance with embodiments of the invention.

FIG. 7 shows an exemplary schematic view of a spray assembly in accordance with embodiments of the invention. In the illustrated embodiment, an exemplary spray assembly 700 is shown that comprises a housing 705, a coupling element 706 connected to the housing 705, and a seal assembly 706. Spray assembly 750 further comprises a first set of nozzles (710, 712, 714, 716, and 718) that can be coupled to a first supply line 750 and comprises a second set of nozzles (711, 713, 715, 717, and 719) that are coupled to a second supply line 751.

A first nozzle 710 can be coupled to the first supply line 750 using a first supply tube 740 and a first flow control device 730. A second nozzle 712 can be coupled to the first supply line 750 using a second supply tube 742 and a second flow control device 732. A third nozzle 714 can be coupled to the first supply line 750 using a third supply tube 744 and a third flow control device 734. A fourth nozzle 716 can be coupled to the first supply line 750 using a fourth supply tube 746 and a fourth flow control device 736. A fifth nozzle 718 can be coupled to the first supply line 750 using a fifth supply tube 748 and a fifth flow control device 738. Alternatively, a different number of nozzles, supply tubes, and/or flow control devices may be used.

In addition, a sixth nozzle 711 can be coupled to the second supply line 751 using a sixth supply tube 741 and a sixth flow control device 731. A seventh nozzle 712 can be coupled to the second supply line 751 using a seventh supply tube 743 and a seventh flow control device 733. An eight nozzle 714 can be coupled to the second supply line 751 using an eight supply tube 745 and an eight flow control device 735. A ninth nozzle 717 can be coupled to the second supply line 751 using a ninth supply tube 747 and a ninth flow control device 737. A tenth nozzle 719 can be coupled to the second supply line 751 using a tenth supply tube 749 and a tenth flow control device 739. Alternatively, a different number of nozzles, supply tubes, and/or flow control devices may be used.

Spray assembly 700 can also comprise a flow control device 755 that can be used to couple the first supply line 750 with the second supply line 751. This can be done so that the same flow material can be provided to both supply lines. For example, a fluid may be required to obtain a more uniform spray pattern and/or a gas may be used to clean the nozzles. Spray assembly 700 can also comprise a flow control device 756 that can be used to control the flow into the first supply line 750. Spray assembly 700 can also comprise another flow control device 757 that can be used to control the flow into the second supply line 751.

In some embodiments, the spray assembly 700 can also comprise a flow control device 756 that can be used to control the flow of an inert gas into the first supply line 750 and can comprise another flow control device 757 that can be used to control the flow of a solvent into the second supply line 751.

In some embodiments, nozzle assemblies 721, 722, 723, 724, and 725 can be used to support the nozzles. In addition, the nozzle assemblies 721, 722, 723, 724, and 725 may be removably coupled to the housing 705 to facilitate removal, and/or cleaning. In other embodiments, the nozzles may be removably coupled to the nozzle assemblies and may be easily removed for cleaning and/or replacement.

Figure 8:
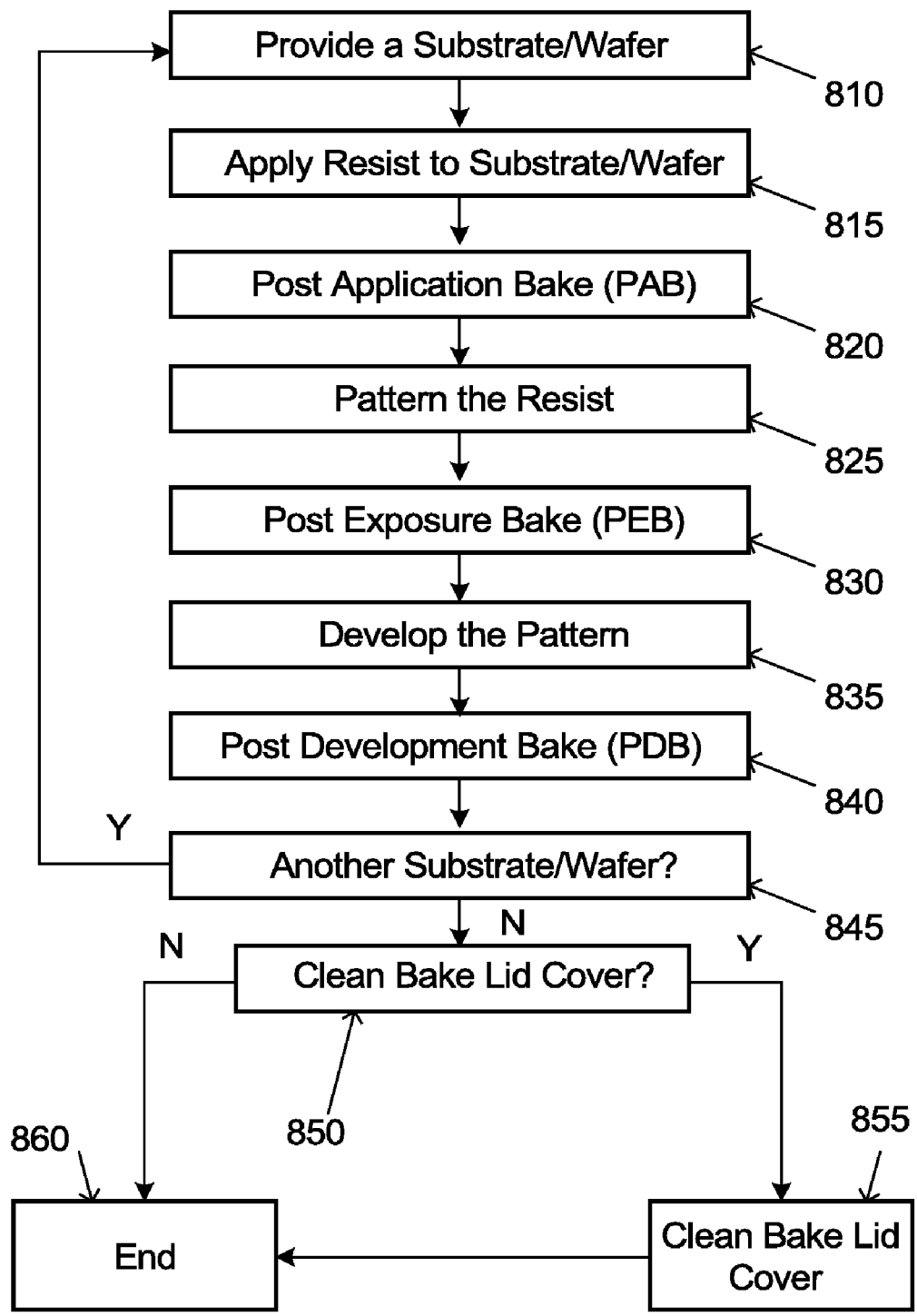
FIG. 8 is a diagrammatic view of a hotplate in accordance with an alternative embodiment of the invention.

FIG. 8 is a simplified process flow diagram for a method of processing resist coated substrate/wafers according to embodiments of the invention. The processing produces a patterned resist that covers portions of the substrate/wafer. For example, during a photolithography process, complex circuit patterns are imaged onto the photosensitive resist material by a lithography tool to provide a physical barrier during further processing of the substrate/wafer to form semiconductor devices. During the further processing, the lithographic pattern can be transferred into the underlying substrate/wafer or substrate/wafer layers by an etching process (e.g., a plasma etching process) that includes selective removal of substrate/wafer material not covered by resist.

The process 800 represents a typical process to which embodiments of the invention can be applied. Referring also to FIGS. 1-3, starting at 810, one ore more substrate/wafers can be provided to a processing system, for example the coating/developing processing system 1 depicted in FIGS. 1-3.

In 815, a resist can be applied to the substrate/wafer. For example, the resist material can be applied by dispensing a liquid containing the resist material onto the substrate/wafer while the substrate/wafer is mounted on a spin chuck (not shown) with a cup (not shown). For example, the resist can be a chemically amplified resist (CAR). A CAR can be characterized by an acid component, a quenched component, and an inhibitor quencher. In one example, an adhesion layer or a surfactant layer can be provided on the substrate/wafer surface before the resist material is applied.

CARs were developed to enhance the exposure process because of the low spectral energy of deep ultraviolet (DUV) radiation. A CAR contains one or more components that are insoluble in a developer solution. These components can comprise chemical protectors. A CAR can also contain a photoacid generator (PAG). During a radiation exposure step, the PAGs produce acid molecules for the patterning process. Desirably, the acid molecules remain inactive until a post exposure bake (PEB) is performed. The PEB drives a deprotection reaction forward in which the thermal energy causes the acid to react with the chemical protectors.

In 820, a post application bake (PAB) can be performed in the coating/developing processing system 1 to cure the applied resist. In an alternate embodiment, a curing step is not required. In addition, a cooling step can be performed after the PAB. In a PAB heating unit, the resist can be heated to temperatures at least higher than room temperature, and in a cooling unit, the resist, can be cooled to temperatures at or below room temperature. During the PAB step, a substrate/wafer can be processed (heated) within a bake plate cover, and during the PAB step, the inner and/or outer surfaces of the bake plate cover can be coated by the one or more by-products produced by curing the resist. In alternate embodiments, a bake plate cover may be cleaned after a PAB step.

In 825, the resist can be patterned in a lithography tool using light radiation or charged particles such as electrons. The desired pattern can, for example, be created on the resist using beams of high-energy electrons or arrays of laser beams and a mask that defines the size and shape of the pattern. For example, deep ultraviolet (DUV) can be used. DUV lithography is a key enabling technology that can be used to manufacture semiconductor devices with features of 0.25 microns (micron=10-6 m) or less.

In other cases, extreme ultraviolet (EUV) sources can be used for critical dimensions below 0.05 microns. EUV lithography utilizes light with wavelengths in a range of about 5 nm to 50 nm, with about 13 nm being the most common.

In 825, the resist pattern is exposed to the light radiation or charged particles for a predetermined time period to achieve a desired exposure dose. Exposure dose refers to the amount of energy (per unit area) that the resist is subjected to upon exposure by a lithography tool. For optical lithography, exposure dose is equal to the light intensity times the exposure time. In resist patterning, resolution is the smallest feature that can be printed (e.g., for a given process and processing system) with sufficient quality. It is common to use focus and exposure dose as process variables, so that resolution is defined as the smallest feature of a given type that can be printed with a specified depth of focus. The depth of focus of a feature is often defined as the range of focus that keeps the resist profile of a given feature within all specifications (e.g., line width, sidewall angle, resist loss) over a specified exposure range.

The lithography tool can contain a controller to control the exposure dose and focus across a substrate/wafer to be patterned. The controller may receive instructions from a CD optimizer system to adjust the exposure dose and focus based on CD metrology data received from the patterned substrate/wafers. Adjusting the exposure dose and focus of the lithography tool establishes adjusted exposure dose and focus settings across the substrate/wafer for patterning additional resist coated manufacturing substrate/wafers.

In 830, a PEB process can be performed in the coating/developing processing system 1 to drive the de-protection reaction forward. The de-protection reaction is acid driven and takes place in the areas exposed to the radiation or to the charged particles. In addition, a cooling step can be performed after the PEB. In a PEB process, the resist can be heated to temperatures at least higher that room temperature, and in a cooling unit, the resist, can be cooled to temperatures at or below room temperature.

The PEB process plays an important role in the process 800. Heat-treating a resist can have many purposes that range from removing a solvent from the resist material to catalyzing the chemical amplification. In addition to the intended results, heat-treating can cause numerous problems. For example, the light or charged particle sensitive component of the resist may decompose at temperatures typically used to remove the solvent, which is an extremely serious concern for a chemically amplified resist since the remaining solvent content has a strong impact on the diffusion and amplification rates. In addition, heat-treating can affect the dissolution properties of the resist and thus have direct influence on the developed resist profile. Many resists are particularly sensitive to temperature variations during a heat-treatment, such as PEB, and temperature variations can result in variations in CDs across a substrate/wafer surface and between different hotplates.

During the PEB step, a substrate/wafer can be processed (heated) within a bake plate cover, and during the PEB step, the inner and/or outer surfaces of the bake plate cover can be coated by the one or more by-products produced by heat-treating the resist. In alternate embodiments, a bake plate cover may be cleaned after a PEB step.

In 835, the resist can be developed in the coating/developing processing system 1 by selectively dissolving exposed areas of the resist. For example, a developing solution, such as a 2.3 wt. % solution of tetramethyl ammonium hydroxide (TMAH), can be used. In addition, rinsing steps can also be performed. For example, a developing solution and/or a rinsing solution can be applied by mounting the substrate/wafer on a spin chuck (not shown) within a cup (not shown).

In 840, a post development bake (PDB) can be performed in the coating/developing processing system 1 to harden the resist pattern in preparation for subsequent pattern transfer into the underlying substrate/wafer or substrate/wafer layers. For example, the post development bake can improve the etch resistance of the patterned resist during plasma etching of the underlying substrate/wafer.

During the PDB step, a substrate/wafer can be processed (heated) within a bake plate cover, and during the PDB step, the inner and/or outer surfaces of the bake plate cover can be coated by the one or more by-products produced by hardening the resist.

In 845, a query can be performed to determine when another substrate/wafer requires processing. One or more wafers can be processed. When another substrate/wafer requires processing, procedure 800 can branch back to 810. When another substrate/wafer does not require processing, procedure 800 can branch back to 850.

In 850, a query can be performed to determine when a bake lid cover requires cleaning. One or more bake lid covers may require cleaning. When a bake lid cover does not require cleaning, procedure 800 can branch to 860. When a bake lid cover does require cleaning, procedure 800 can branch to 855. Procedure 800 can end in 860.

In 855, the bake lid cover can be cleaned, and procedure 800 can end in 860.

FIG. 9 is a simplified block diagram of a cleaning subsystem in accordance with embodiments of the invention. In the illustrated embodiment, a single cleaning subsystem 900 is shown. Alternatively, other configurations may be used.

The cleaning subsystem 900 can comprise an outer assembly 905 that can be used to mount the cleaning subsystem within the coating/developing processing system 1 (FIG. 1). The outer assembly allows the cleaning subsystem 900 to be easily and quickly removed and/or installed during a setup and/or maintenance operation.

The cleaning subsystem 900 can comprise a processing module 930 that can include a wafer holder 931. Alternatively, a processing module may not be required. The wafer holder 931 can include a temperature control subassembly 934 for controlling the temperature of the wafer 935. The wafer holder 931 can include a plurality of pins 932 for controlling the position of the wafer 935. For example, the plurality of pins 932 can be used for controlling the position of the wafer 935 during loading and/or unloading. The wafer holder 931 can include a sealing subassembly 933 for sealing the wafer holder 931 to the bake plate cover assembly 910.

The bake plate cover assembly 910 can comprise a bake plate cover 911 having an inner surface 915 that can define a process space 916. The bake plate cover assembly 910 can comprise an exhaust port 912 coupled to the inner surface 915 and process space 916. In some embodiments, the exhaust port 912 can comprise a valve 909 and/or exhaust sensor 908. For example, valve 909 can be used for controlling flow in and/or out of the processing space 916, and exhaust sensor 908 can be used for determining the processing state for the bake lid cover. In addition, one or more exhaust pipes 913 can be coupled to an evacuation unit (not shown) and/or a process gas supply system (not shown). In some embodiments, an evacuation unit may include one or more exhaust sensors and a process gas supply system may include one or more inlet sensors. The bake plate cover assembly 910 can also comprise a plurality of alignment features 907, and 924 for positioning the bake plate cover assembly 910 within the cleaning subsystem 900. Exhaust port 912 can be used to exhaust cleaning and/or other processing gasses that must be fed through the lid. Exhaust pipes 913 can comprise flexible hose or hoses so the lid can move back and forth between bake and clean modules without intervention. This also allows use of exhaust and/or other gasses to dry channeled areas within the lid after the spray clean process is complete.

Furthermore, the bake plate cover assembly 910 can comprise a circular opening 917 having a diameter 918. The bake plate cover assembly 910 can include a sealing surface 919. The diameter 918 can be greater 2-10 mm greater than the diameter of the wafer 935 being processed. For example, the wafer 935 can be 200 mm, 300 mm, or 450 mm in diameter. Alternatively, the opening may have a square or a rectangular shape.

The cleaning subsystem 900 can comprise a cleaning module 940 that can include a lower assembly 941. The lower assembly 941 can include a fluid capture basin 942, a first drain 943 coupled to the fluid capture basin 942, and a first control valve 944 coupled to the first drain 943. The first control valve 944 can be coupled to a recirculation system 901. Recirculation system 901 can be configured to analyze, filter, and/or re-use one or more re-circulated cleaning solvents. In addition, the lower assembly 941 can include a second drain 948 coupled to the fluid capture basin 942, and a second control valve coupled 947 to the second drain 948. The second control valve 947 can be coupled to a fluid disposal system 902. Fluid disposal system 902 can be configured to analyze, and/or remove one or more non-re-circulated cleaning solvents after they are used. For example, there can be two solvent use modes. One can use a filtered, re-circulating 5-gallon reservoir used for course cleaning and minimizing chemical cost and disposal. The second mode uses a final rinse of fresh solvent that goes directly to the facilities drain. The first or second drain can be automatically selected depending on the solvent mode used, the first drain can provide a path to a reservoir, and the second drain can provide a path to the facilities drain. Alternatively, one or more diverter valves may be automatically selected depending on the solvent mode used, one way to reservoir, the other to facilities drain.

Furthermore, the lower assembly 941 can include a mating surface 949 and a shutter 957. In some embodiments, the fluid capture basin 942 can have a diameter 954 that can be 5-25 mm larger than the diameter 918 of the bake plate lid cover, and this ensures that the edges of the bake plate lid cover are cleaned. In addition, the cleaning process can include one or more steps to clean and/or dry the mating surface 949.

The lower assembly 941 can include a coupling sub-assembly 946 that can be coupled to a control assembly 945 and to the spray assembly 950. In some embodiments, the nozzle assembly 950 can be removably coupled to the control assembly (945) to allow the nozzle assembly 950 to be removed, cleaned, and/or replaced during maintenance procedures. In other embodiments, nozzles (not shown) may be removed, cleaned, and/or replaced on the nozzle assembly 950. Control assembly 945 can be used to control the rotational speed of the spray assembly 950 the types of fluids and/or gasses provided to the spray assembly 950, and the flow rates for the supplied fluids and/or gasses. Alternatively, the coupling sub-assembly 946 may be used to rotate the spray assembly 950 and/or may be used to provide and/or control fluids and/or gasses to the spray assembly 950.

The cleaning module 940 can include a spray assembly 950 that can include a rotatable arm 951 coupled to a plurality of nozzle assemblies 953. Alternatively, a different number of arms may be used. In the illustrated embodiment, five nozzles assemblies 953 are shown, but this is not required for the invention. In alternate embodiments, a different number of nozzles and/or a different nozzle configuration may be used. The spray assembly can be configured to provide controlled amounts of fluids and/or gasses to each of the nozzle assemblies 953. The spray assembly 950 can include one or more valves (not shown). In addition, the nozzle assembly 953 can include one or more nozzles (not shown) and one or more valves (not shown). For example, separate nozzles and/or valves may be used for fluids and gasses. Alternatively, nozzles and/or valves may be used for both fluids and gasses.

In some embodiments, one or more of the nozzles can produce a fan spray, and the fan spray from each nozzle can be overlapped to insure 100% coverage of the lid surface. In other embodiments, one or more of the nozzles can produce a curved spray pattern, and the curved spray pattern from each nozzle can be overlapped to insure 100% coverage of the lid surface. Each nozzle can be independently controlled. Solvent to clean and inert gas to dry the lid can be sprayed through the same nozzles. The spray assembly 950 can rotate from 1 to 100 rpm with any material flowing.

Figure 9B:
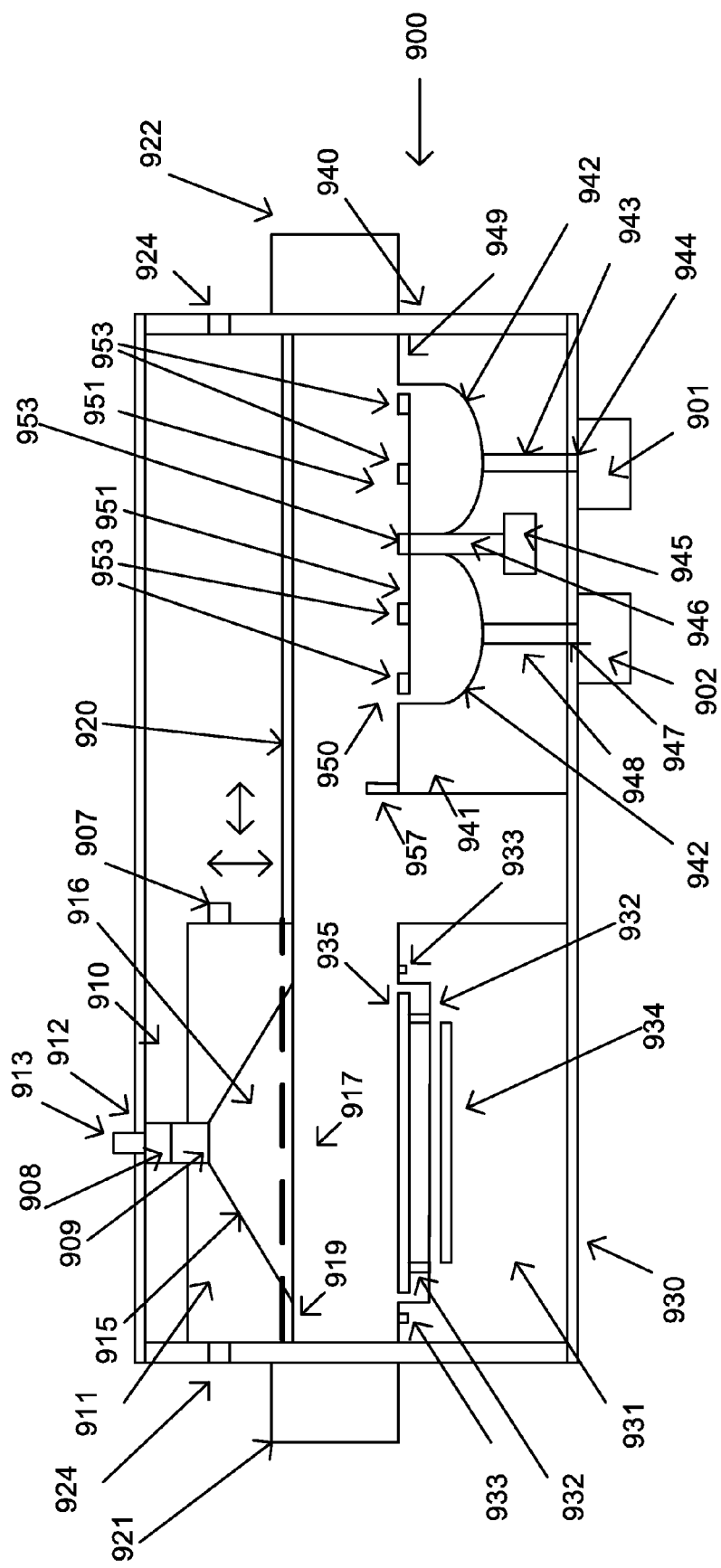
FIG. 9 is a simplified process flow diagram for a method of patterning a resist coated wafer according to an embodiment of the invention.
Figure 9C:
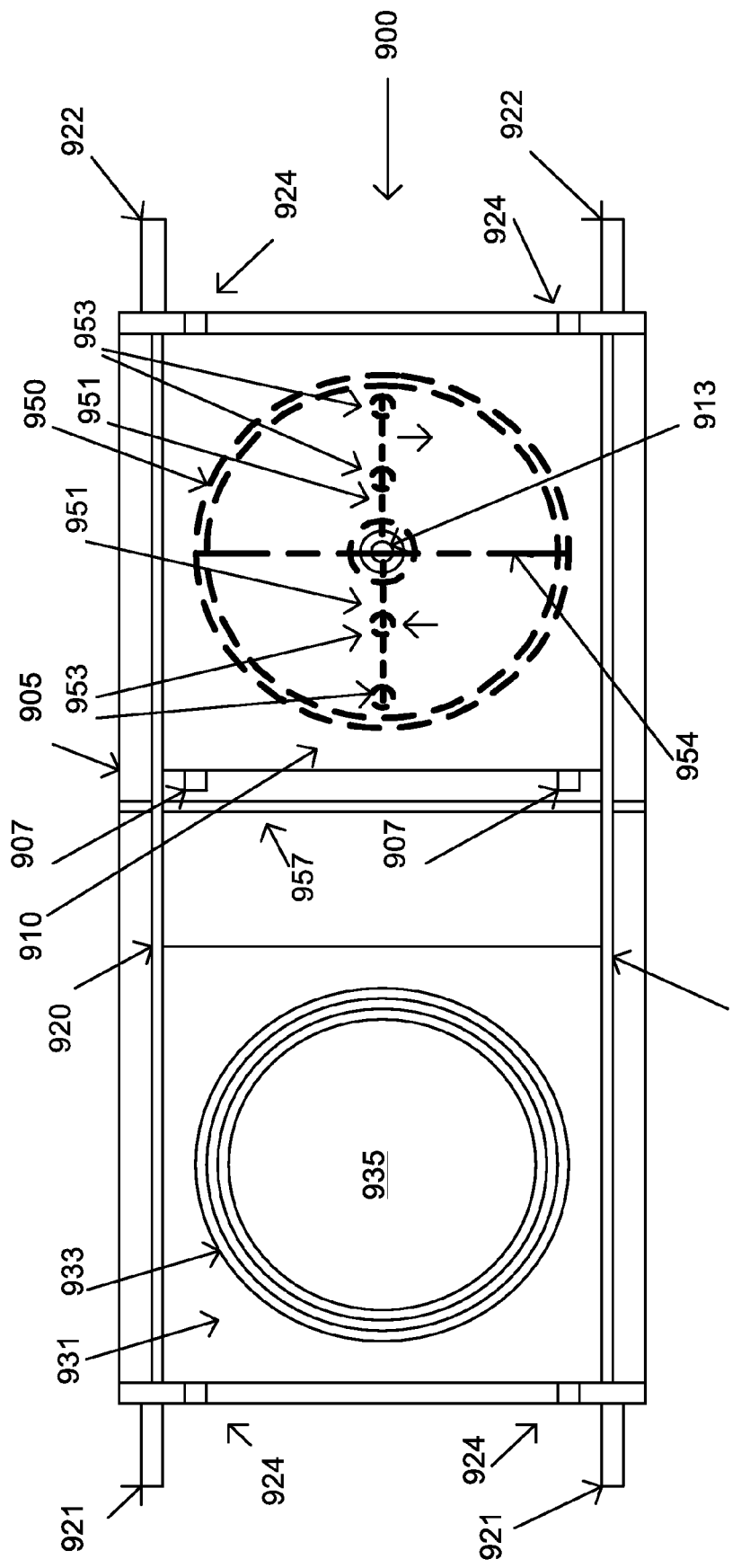
Figure 9D:
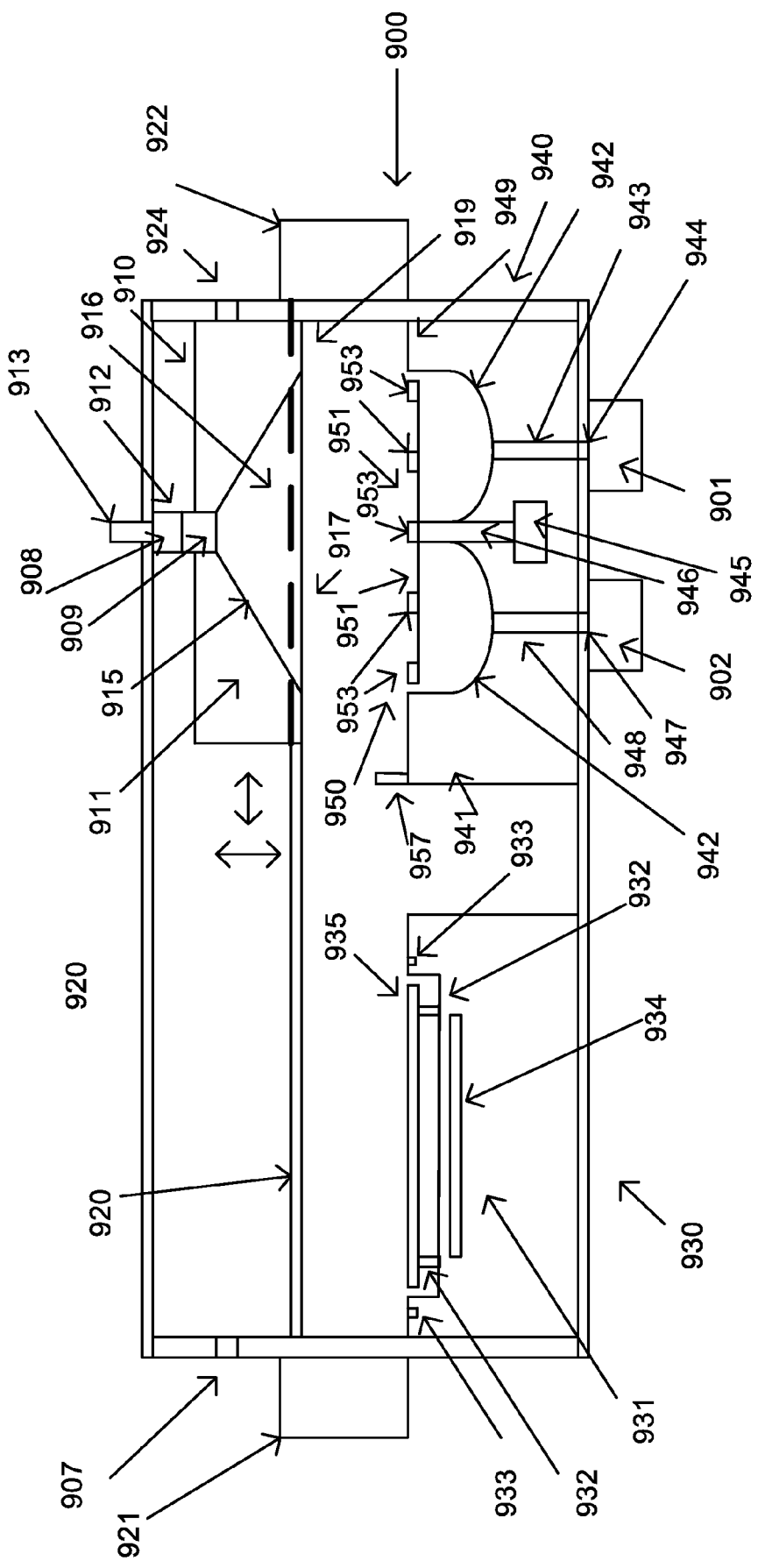

The cleaning subsystem 900 can comprise a translation assembly 920, first position control units 921, and second position control units 922 that can be used to move the bake plate cover assembly 910 from a processing module 930 as shown in FIGS. 9A-9B to a cleaning module 940 as shown in FIGS. 9C-9D. The translation assembly 920, first position control units 921, and second position control units 922 can be used to move the bake plate cover assembly 910 vertically and horizontally. The translation assembly 920, first position control units 921, and/or second position control units 922 can provide a first sealing force to the bake plate cover assembly 910 during processing and can provide a controllable position for the bake plate cover assembly 910 during cleaning. In some embodiments, the bake plate cover assembly 910 can be raised and/or lowered during cleaning.

In one embodiment, bake plate cover assembly 910 can be suspended over the bake plate and bake plate cleaner using rails and pistons. For example, four pistons may be, two on each side of the bake plate cover assembly 910, which can move the bake plate cover assembly 910 back and forth along the rail between the bake plate and lid cleaner module. In other embodiments, a screw type mechanism may be used. The cleaning system can comprise hard stop alignment features 907 and 924 that can be used to lock and seal the bake plate cover assembly 910 during either process.

Figure 10:
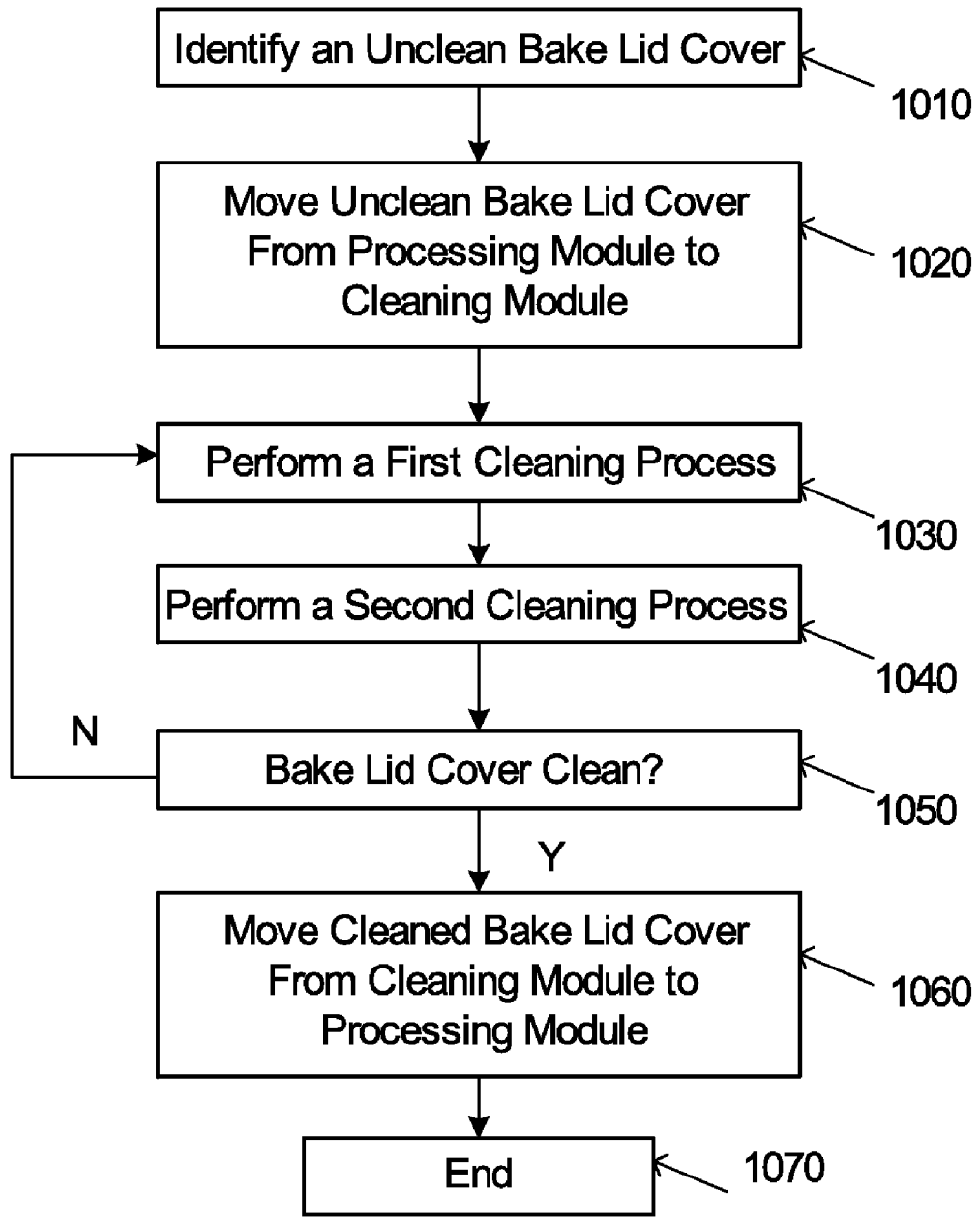
FIG. 10 is a simplified process flow diagram of a method for controlling and rapidly lowering the temperature of a hotplate used for supporting and heat-treating wafers in accordance with an embodiment of the invention.

FIG. 10 is a simplified process flow diagram of a method for cleaning a bake plate cover in accordance with embodiments of the invention. In the illustrated embodiment, an exemplary cleaning procedure 1000 is shown. Alternatively, other procedures may be performed.

In 1010, an unclean bake lid cover can be identified. "Time to clean" triggers can be monitored by the tool, and a fully automated cleaning process can be implemented to minimize human intervention and potential error. If customer defect levels require the lid to be cleaned after every wafer, this can be programmed to occur. Down time and productivity lost due to Preventative Maintenance (PM) cleaning activities are minimized since the fully automated cleaning process/design allows the cleaning cycle to occur without stopping the entire tool. In addition, since the tools is not "opened" or disassembled, no post cleaning process testing (verification) is required. Furthermore, maintenance personnel are not exposed to solvent vapors, polymer residues or potential lifting or handling injuries since the lids are not removed and/or cleaned by maintenance personnel.

In 1020, a bake plate cover can be moved from a processing module to a cleaning module. In some embodiments, a track system can be used.

In 1030, a first cleaning process can be performed. The first cleaning process can include one or more spraying steps and one or more drying steps. The spraying steps and/or drying steps can have durations from approximately 10 seconds to approximately 300 seconds. For example, a re-circulation solvent cleaning process can be performed that can use a filtered, re-circulating 5 gallon reservoir. The re-circulation solvent cleaning process can be used for course cleaning and can be used to minimize chemical cost and disposal. In alternate embodiments, one or more non-re-circulating steps may be performed. One or more diverter valves (not shown) can be automatically selected depending on the cleaning process and/or solvent used.

In 1040, a second cleaning process can be performed. For example, a non-recirculation solvent cleaning process can be performed. The second cleaning process can include one or more spraying steps and one or more drying steps. The spraying steps and/or drying steps can have durations from approximately 10 seconds to approximately 300 seconds. For example, a non-recirculation solvent cleaning process can be performed that can use one or more final rinses using one or more different solvents that can be sent directly to one or more facilities drains. In alternate embodiments, one or more re-circulating steps may be performed. One or more diverter valves (not shown) can be automatically selected depending on the cleaning process and/or solvent used.

Nitrogen or any other gas can be used during a drying step and can be provided through one or more nozzles in one or more nozzle assemblies 953 in the spray assembly 950. In some embodiments, nitrogen or any other gas can be used during a cooling step and can be provided through one or more nozzles in one or more nozzle assemblies 953 in the spray assembly 950.

In some embodiments, gasses can be exhausted using the exhaust port 912 and the exhaust pipe 913 during the cleaning, drying, and/or cooling steps.

The cleaning frequency and the cleaning process is programmable and can be executed based on time, number of wafers processed or bake exhaust values (alarm condition or minimum exhaust value measured during processing).

In 1050, a query can be performed to determine when a bake lid cover requires additional cleaning. One or more bake lid covers may require additional cleaning. When a bake lid cover does not require additional cleaning, procedure 1000 can branch to 1070. When a bake lid cover does require additional cleaning, procedure 1000 can branch back to 1030. Procedure 1000 can end in 1070.

In some embodiments, one or more temperature sensors (not shown) can be used to measure the bake lid temperature. Alternately, optical techniques can be used to measure temperature.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative system and methods, and illustrative examples shown and described. Accordingly, departures may be made from such details without departing from the scope of applicants' general inventive concept.

What is claimed is:

1. A method of processing a wafer comprising:

positioning a wafer on a bake plate in a processing module (930);

lowering a bake plate cover assembly (910) having a bake plate cover (911) over the wafer during a baking process;

raising the bake plate cover assembly (910) after the baking process;

removing the wafer from the bake plate;

determining a first processing state for the bake plate cover assembly (910) and either processing another wafer if the first processing state is a first value or establishing a cleaning process for the bake plate cover assembly (910) if the first processing state is a second value, wherein the establishing the cleaning process comprises:

moving the bake plate cover assembly (910) to a cleaning module (940) having a nozzle assembly (950) therein, positioning the nozzle assembly (950) at a first cleaning position within the bake plate cover (911);

rotating the nozzle assembly (950) at a first cleaning speed within the bake plate cover (911) while spraying a first solvent solution on an inner surface (915) of the bake plate cover (911); and rotating the nozzle assembly (950) at a first drying speed within the bake plate cover (911) while spraying on the inner surface (915) of the bake plate cover (911) a first drying gas that comprises nitrogen ($N_2$); and determining a second processing state for the bake plate cover (911) and either moving the bake plate cover assembly (910) to the processing module (930) if the second processing state is a first value or re-cleaning the bake plate cover (911) if the second processing state is a second value.

2. The method of claim 1, further comprising:
spraying a first rinsing solution on the inner surface (915) of the bake plate cover (911) after spraying the first solvent solution on the inner surface (915) of the bake plate cover (911); and
drying the inner surface (915) of the bake plate cover (911).

3. The method of claim 1, further comprising:
spraying a first rinsing solution on the inner surface (915) of the bake plate cover (911) after spraying the first solvent solution on the inner surface (915) of the bake plate cover (911).

4. The method of claim 1, further comprising:
spraying a second solvent solution on the inner surface (915) of the bake plate cover (911) after spraying the first drying gas on the inner surface (915) of the bake plate cover (911), and
drying the inner surface (915) of the bake plate cover (911).

5. The method of claim 1, further comprising:
spraying on the inner surface (915) of the bake plate cover (911) a second solvent solution having a different concentration than the first solvent solution, after spraying the first drying gas on the inner surface (915) of the bake plate cover (911); and
performing a second drying process that includes spraying the inner surface (915) of the bake plate cover (911) with an inert gas for a second period of time.

6. The method of claim 1, further comprising:
spraying the first solvent solution on a sealing surface (919) of the bake plate cover (911), and
spraying the sealing surface (919) of the bake plate cover (911) with an inert gas for a first period of time.

7. The method of claim 1, further comprising:
rotating the nozzle assembly (950) at a second cleaning speed within the bake plate cover (911) while spraying a second solvent solution on the inner surface (915) of the bake plate cover (911); and
rotating the nozzle assembly (950) at a second drying speed within the bake plate cover (911) while spraying on the inner surface (915) of the bake plate cover (911) a second drying gas that comprises nitrogen ($N_2$).

8. The method of claim 1, further comprising:
rotating the nozzle assembly (950) at a first cooling speed within the bake plate cover (911) while spraying on the inner surface (915) of the bake plate cover (911) a first cooling gas that comprises nitrogen ($N_2$) before spraying the first solvent solution on the inner surface (915) of the bake plate cover (911).

9. The method of claim 1, further comprising:
rotating the nozzle assembly (950) at a first cooling speed within the bake plate cover (911) while spraying a first cooling gas that comprises nitrogen ($N_2$) on an inner surface (915) of the bake plate cover (911) before spraying the first solvent solution on the inner surface (915) of the bake plate cover (911).

10. The method of claim 1, further comprising:
using a re-circulated solvent solution while spraying the first solvent solution on the inner surface (915) of the bake plate cover (911); and
rotating the nozzle assembly (950) at a second cleaning speed for a second time within the bake plate cover (911) while spraying a non-re-circulated solvent solution on the inner surface (915) of the bake plate cover (911).

11. The method of claim 10, wherein the re-circulated solvent solution comprises a particle containing solvent from previously cleaning the inner surface (915) of the bake plate cover (911) and the non-re-circulated solvent solution comprises a clean solvent.

12. The method of claim 10, wherein the second processing state is determined using exhaust data, solvent data, time, contamination data, thermal data, optical data, process data, historical data, or particle data, or any combination thereof.

13. The method of claim 1, wherein the first processing state is determined using exhaust data, time, contamination data, thermal data, optical data, process data, historical data, or particle data, or any combination thereof.

14. A system for processing a wafer comprising:
a wafer transporting system for positioning a wafer on a bake plate in a processing module (930), and for removing the wafer after the wafer is processed;
first position control units (921) for lowering a bake plate cover assembly (910) having a bake plate cover (911) over the wafer during a baking process, and for raising the bake plate cover (911) after the baking process;
a controller programmed to determine a first processing state for the bake plate cover (911) and for either instructing the processing module (930) to process another wafer if the first processing state is a first value or for determining a cleaning process for the bake plate cover (911) if the first processing state is a second value;
a translation assembly (920) configured for moving the bake plate cover assembly (910) to a cleaning module (940) when the first processing state is the second value;
a nozzle assembly (950) configured to be removably positioned within the bake plate cover (911) by the translation assembly (920); and
a control assembly (945) configured to rotate the nozzle assembly (950) at a first cleaning speed for a first time within the bake plate cover (911) while the nozzle assembly (950) sprays a re-circulated solvent solution on an inner surface (915) of the bake plate cover (911), to rotate the nozzle assembly (950) at a second cleaning speed for a second time within the bake plate cover (911) while the nozzle assembly (950) sprays a non-re-circulated solvent solution on the inner surface (915) of the bake plate cover (911), and to rotate the nozzle assembly (950) at a first drying speed for a third time within the bake plate cover (911) while the nozzle assembly (950) sprays a first drying gas on the inner surface (915) of the bake plate cover (911), and wherein the controller determines a second processing state for the bake plate cover (911) and either instructs the translation assembly (920) to move the bake plate cover assembly (910) to the processing module (930) if the second processing state is a first value or instructs the cleaning module (940) to re-clean the bake plate cover (911) if the second processing state is a second value.

15. The system of claim 14, further comprising:
a first drain for the re-circulated solvent solution; and
a second drain for the non-re-circulated solvent solution.

16. The system of claim 14, further comprising:
an exhaust sensor for determining the first processing state, the second processing state, or both.

17. A system for processing a wafer comprising:
means for positioning a wafer on a bake plate in a processing module (930);
means for lowering a bake plate cover assembly (910) having a bake plate cover (911) over the wafer during a baking process;
means for raising the bake plate cover assembly (910) after the baking process;
means for removing the wafer from the bake plate;
means for determining a first processing state for the bake plate cover assembly (910); and means for responding to the determining means for either processing another wafer if the first processing state is a first value or for establishing a cleaning process in a cleaning module (940) for the bake plate cover assembly (910) if the first processing state is a second value, wherein the cleaning module (940) comprises:

means for moving the bake plate cover assembly (910) to the cleaning module (940);

means for positioning a nozzle assembly (950) at a first cleaning position within the bake plate cover (911);

means for rotating the nozzle assembly (950) at a first cleaning speed within the bake plate cover (911) while spraying a first solvent solution on an inner surface (915) of the bake plate cover (911);

means for rotating the nozzle assembly (950) at a first drying speed within the bake plate cover (911) while spraying on the inner surface (915) of the bake plate cover (911) a first drying gas that comprises nitrogen ($N_2$);

means for determining a second processing state for the bake plate cover (911); and means for moving the bake plate cover assembly (910) to the processing module (930) if the second processing state is a first value.

18. The system of claim 17, further comprising:

an exhaust sensor for determining the first processing state, the second processing state, or both.

* * * * *